US006663786B2

United States Patent
Edwards et al.

(10) Patent No.: US 6,663,786 B2
(45) Date of Patent: Dec. 16, 2003

(54) STRUCTURE HAVING EMBEDDED FLUSH CIRCUITRY FEATURES AND METHOD OF FABRICATING

(75) Inventors: Robert Douglas Edwards, Binghamton, NY (US); Jeffrey Alan Knight, Endwell, NY (US); Allen Frederick Moring, Vestal, NY (US); James W. Wilson, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 09/881,070

(22) Filed: Jun. 14, 2001

(65) Prior Publication Data

US 2002/0192439 A1 Dec. 19, 2002

(51) Int. Cl.$^7$ ................................................ H01B 13/00
(52) U.S. Cl. .............................. 216/13; 216/14; 216/75; 216/52; 29/847
(58) Field of Search ............................. 216/13, 14, 75, 216/52; 438/691, 692; 29/867, 868

(56) References Cited

U.S. PATENT DOCUMENTS

| 5,647,966 | A | | 7/1997 | Uriu et al. |
| 5,664,325 | A | * | 9/1997 | Fukutomi et al. .............. 29/848 |
| 5,821,168 | A | | 10/1998 | Jain |
| 5,822,850 | A | | 10/1998 | Odaira et al. |
| 5,822,856 | A | * | 10/1998 | Bhatt et al. .................... 29/832 |
| 5,976,393 | A | | 11/1999 | Abe |
| 5,977,642 | A | * | 11/1999 | Appelt et al. ................ 257/780 |
| 6,130,161 | A | * | 10/2000 | Ashley et al. ............... 438/687 |
| 6,270,889 | B1 | * | 8/2001 | Kataoka et al. .............. 428/352 |

* cited by examiner

*Primary Examiner*—Gregory Mills
*Assistant Examiner*—Lan Vinh
(74) *Attorney, Agent, or Firm*—Connolly Bove Lodge & Hutz LLP; Arthur J. Samodovitz

(57) ABSTRACT

Embedded flush circuitry features are provided by depositing a conductive seed layer on the front side of a sacrificial carrier; plating a layer of conductive metal onto the seed layer and personalizing circuitry features. The front side of the carrier film is embedded into a dielectric material and the sacrificial carrier film is removed.

22 Claims, 1 Drawing Sheet

STRUCTURE HAVING EMBEDDED FLUSH CIRCUITRY FEATURES AND METHOD OF FABRICATING

FIELD OF THE INVENTION

The present invention relates to providing a structure having circuitry features and in particular to embedded flush circuitry features. The present invention is especially advantageous for fabricating buried interconnection levels that are in close proximity to one another in a printed circuit board structure.

BACKGROUND OF THE INVENTION

Printed circuit boards find a wide variety of uses in the electronics industry with the demand for high performance, printed wiring, or circuit boards for various applications steadily increasing. For instance, the complexity, compactness and electrical performance requirements of printed boards have significantly increased over the last several years.

The demands on printed circuit boards require high density packaging, fine interconnection, multilayer formation and the need to form a plurality of interconnections in a small space.

Currently, printed circuit board interconnection levels are built on top of a dielectric thin film layer. Circuitry features are formed using photolithographic and subtractive etch techniques. In a typical method, a metallic foil and especially copper foil is laminated to the substrate followed by using photolithographic and subtractive etching to create the circuitry. The copper foil includes a roughened or dendritic backside surface for inducing mechanical adhesion to the substrate. Smooth copper layers do not adequately bond without an auxiliary bonding agent. Great difficulties exist in adequately etching dendrites especially when dealing with small spaces. Moreover, along with the concern created by dendrites, the width of the lines (e.g. about 0.5 mils wide), and photolithographic issues (e.g. resolution of fine features, 0.7 mil wire with 1.1 mil space, in a thin photo resist film), and subtractive etch undercut/pad rounding, render clearly and fully resolving small line spaces such as the 1.8 mil pitch features presently desired very difficult. Additionally, this subtractive etch approach results in unprotected circuitry features referred to as "skyscrapers" that extend above an underlying plane of dielectric barrier material.

In many structures, it is important to plate another metal such as gold or nickel gold onto the copper circuitry. The "skyscraper" structure causes a problem of bridging or shorting between lines especially where there exist closely spaced features.

SUMMARY OF THE INVENTION

The present invention provides for obtaining a structure having dense embedded flush circuitry features. The present invention makes it possible to create circuitry features that are much more densely configured than those fabricated using current methods. This is made possible since the final structure is a circuitry feature having dielectric regions and conductive features that are coplanar.

In particular, the present invention relates to a structure comprising a substrate having a surface; a polymeric dielectric applied to said surface of said substrate; conductive circuitry features embedded in said polymeric dielectric, wherein said conductive circuitry features are substantially flush with and surrounded by said polymeric dielectric.

The present invention also relates to a method for fabricating a structure having embedded flush circuitry features. The method comprises:

providing a sacrificial carrier film having a front side and a back side;

depositing a conductive seed layer on said front side of said sacrificial carrier film;

plating a layer of conductive metal onto said seed layer;

personalizing circuitry features on said layer of conductive metal;

embedding said front side of said sacrificial carrier film having the circuitry features into a dielectric material; and removing said sacrificial carrier film.

The present invention also relates to a structure obtained by the above process. Still other objects and advantages of the present invention will become readily apparent by those skilled in the art from the following detailed description, wherein it is shown and the preferred embodiments of the invention are described, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

DETAILED DESCRIPTION OF THE INVENTION

Figure 1:
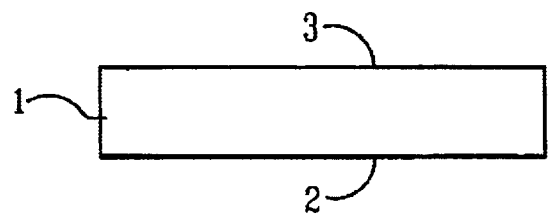
FIGS. 1–6 are schematic drawings illustrating a structure at various stages of fabrication according to the present invention.

As shown in FIG. 1, the structure of the present invention having embedded flush or coplanar circuitry features can be produced by employing a sacrificial carrier film 1 having a front side 2 and a back side 3. Typical sacrificial films include polyimides such as Kapton and Upilex. The sacrificial films are typically about 20 to about 250 thick, and more typically about 50 to about 100 microns thick.

The carrier is preferably smooth thereby eliminating metallic dendrites in the subsequently to be provided metal layer.

Figure 2:
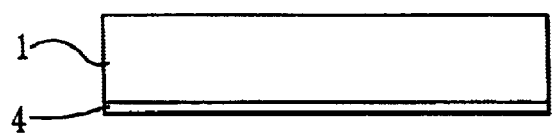

Next a relatively thin seed layer of a conductive metal 4 is deposited onto the front side of the sacrificial carrier film 1, as illustrated in FIG. 2. Typical metals include copper and chromium with copper being preferred. The seed layer is typically about 500 to about 2000 angstroms thick, a particular example being about 1000 angstroms. The seed layer can be deposited by electroless plating.

Figure 3:
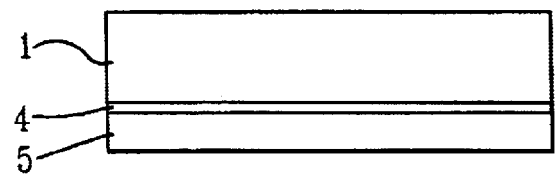

A conductive thin film 5 such as copper is then plated onto the seed layer 4 as shown in FIG. 3. The conductive film is typically up to about 20 microns, more typically about 5 to about 20 microns and preferably about 5 to about 10 microns. The conductive film can be deposited by electroless plating, or electroplating that are well known in the art. The preferred method of depositing the conductive film is by electroless plating.

It is preferred that the coated metal be free of dendrites, which cause skyscrapers and density issues.

Figure 4:
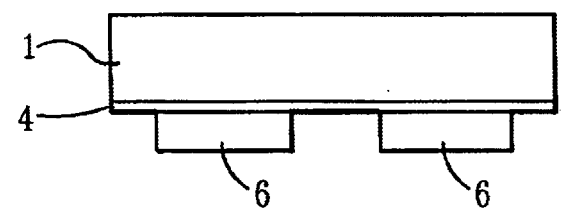

Circuitry features 6 as shown in FIG. 4 on the layer of the conductive metal are then personalized by photolithographic and subtractive etching techniques, as are well known to those skilled in the art.

The circuit lines are typically about 0.5 to about 1 mil wide and about 0.5 to about 2 mils separated apart.

Figure 5:
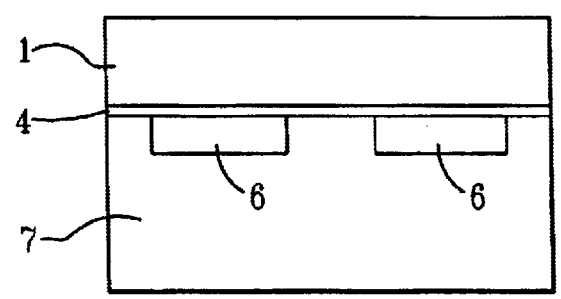
Figure 6:
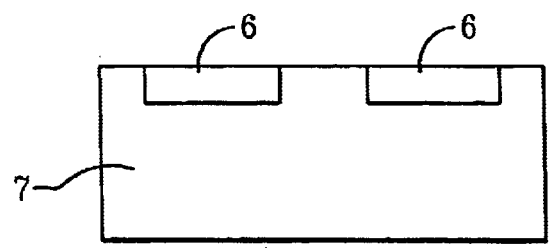

The structure with the front side having the circuitry features 6 is then embedded into the polymeric dielectric material 7 such as by laminating as shown in FIG. 5.

The dielectric material can be a thermoplastic resin or thermosetting resin. When a thermosetting resin is employed it is in the uncured or partially cured (B-stage) until after the embedding is completed. At that point, the thermosetting resin can be fully cured.

Typical thermosetting resins include epoxy resins, polyimides, bis-maleimide-triazine resins, and melamine resins.

Typical thermoplastic resins include polyimides, polytetrafluoroethylene resins, hexafluoro propylene resin, polyether sulfone resins and polyolefins such as polyethylene and polypropylene.

Typically the dielectric material is about 20 to about 200 microns and more typically about 50 to about 100 microns thick.

The preferred dielectric materials employed are epoxy resins and polyimide resins.

The sacrificial carrier film 1 is next removed such as by dissolving it in a suitable solvent, which does not attack the remaining constituents of the structure or preferably by peeling. Suitable solvents for a polyimide sacrificial film include KOH aqueous solutions. The sacrificial carrier film should therefore differ from the dielectric material.

The resulting structure contains circuitry features 6 that are protected within the surrounding dielectric material 7 thereby eliminating many contamination, bridging, topography, and electromigration issues.

The above process of the present invention can also be used with a rough carrier that would leave the dendrite surface exposed after removing the sacrificial carrier film. In that event a chemical mechanical polish operation would be used to "smooth" the exposed copper feature surfaces. In this case the sacrificial carrier film is removed such as by dissolving it in a suitable solvent, which does not attack the remaining constituents of the structure. Suitable solvents for a polyimide sacrificial film include KOH aqueous solutions.

In addition, if desired, the copper circuit lines can be plated with another conductive metal such as gold or nickel-gold as well known in the art.

Moreover, the resulting structure obtained pursuant to the above processing can then be joined together to form a multilayer circuit board.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method of fabricating a structure having embedded flush circuitry features which comprises:
   providing a sacrificial polyimide carrier film having a front side and a back side;
   depositing a conductive seed layer on said front side of the sacrificial polyimide carrier film;
   plating a layer of conductive metal onto said seed layer;
   personalizing circuit features in said layer of conductive material;
   embedding said front side of said sacrificial polyimide carrier film having said circuitry features into a dielectric material; and
   then removing said sacrificial polyimide carrier film.

2. The method of claim 1 further including removing said conductive seed layer from said circuitry features.

3. The method of claim 2 wherein the metal circuitry features comprise copper.

4. The method of claim 2 wherein the circuitry features are up to 20 microns thick.

5. The method of claim 2 wherein the circuitry features are about 5 to about 20 microns thick.

6. The method of claim 2 wherein the circuitry features are about 5 to about 10 microns thick.

7. The method of claim 2 wherein the dielectric material comprises an epoxy resin or polyimide resin.

8. The method of claim 2 which further comprises depositing another conductive metal on the circuitry features.

9. The method of claim 8 wherein another conductive metal comprises gold or nickel-gold.

10. The method of claim 2 wherein the sacrificial film is about 25 to about 250 microns thick.

11. The method of claim 2 wherein the sacrificial film has smooth surfaces, and the layer of conductive metal is free of dendrites.

12. The method of claim 2 wherein the seed layer comprises copper or chromium.

13. The method of claim 2 wherein the seed layer is about 500 to about 2000 angstroms thick.

14. The method of claim 2 wherein the embedding comprises laminating.

15. The method of claim 2 which comprises joining at least two structures having said embedded flush circuitry features together.

16. The method of claim 2 wherein said layer has a thickness of about 20 microns or less.

17. The method of claim 2 wherein the layer of conductive metal upon removing the carrier film has dendrites.

18. The method of claim 17 which further comprises chemical-mechanical polishing of the layer of conductive metal to render it smoother and flush with said dielectric.

19. A method of fabricating a structure having embedded flush circuitry features of up to about 20 microns thick comprising copper which comprises:
   providing a sacrificial polyimide carrier film having a front side and a back side;
   depositing a conductive seed layer on said front side of the sacrificial polyimide carrier film;
   depositing a conductive metal on said seed layer;
   personalizing circuitry features in said layer of conductive metal;
   embedding by laminating said front side of said sacrificial polyimide carrier film having said features into a dielectric material;
   then removing said sacrificial polyimide carrier film; and said conductive seed layer from said circuitry features.

20. The method of claim 19 wherein the sacrificial film has smooth surfaces, and the layer of conductive metal is free of dendrites.

21. The method of claim 19 which comprises joining at least two structures having said embedded flush circuitry features together.

22. The method of claim 19 wherein the circuitry features are up to 20 microns thick.

* * * * *